US012645146B2

(12) United States Patent
Jeon et al.

(10) Patent No.: US 12,645,146 B2
(45) Date of Patent: Jun. 2, 2026

(54) SUBSTRATE PROCESSING APPARATUS AND METHOD THEREOF

(71) Applicant: SEMES CO., LTD., Cheonan-si (KR)

(72) Inventors: Myung A Jeon, Jeollanam-do (KR); Young Seop Choi, Chungcheongnam-do (KR); Bok Kyu Lee, Chungcheongnam-do (KR); Joo Sung Lee, Chungcheongnam-do (KR); Je Myung Cha, Busan (KR)

(73) Assignee: Semes Co., Ltd.

( * ) Notice: Subject to any disclaimer, the term of this patent is extended or adjusted under 35 U.S.C. 154(b) by 20 days.

(21) Appl. No.: 18/501,265

(22) Filed: Nov. 3, 2023

(65) Prior Publication Data

US 2024/0210836 A1     Jun. 27, 2024

(30) Foreign Application Priority Data

Dec. 27, 2022    (KR) ........................ 10-2022-0186311

(51) Int. Cl.
*G03F 7/42*          (2006.01)
*H10P 72/00*         (2026.01)

(52) U.S. Cl.
CPC .......... *G03F 7/422* (2013.01); *H10P 72/0414* (2026.01)

(58) Field of Classification Search
None
See application file for complete search history.

(56) References Cited

U.S. PATENT DOCUMENTS

2006/0037699 A1*   2/2006   Nakamori ............. B24B 37/013
                                                        156/345.12

FOREIGN PATENT DOCUMENTS

| | | |
|---|---|---|
| JP | 2004-281463 A | 10/2004 |
| JP | 2013-045961 A | 3/2013 |
| JP | 2015-115456 A | 6/2015 |
| KR | 10-2007-0023954 A | 3/2007 |
| KR | 10-2011-0056975 A | 5/2011 |
| KR | 10-1674263 | 11/2016 |

OTHER PUBLICATIONS

Google Patents translation of JP2013045961A (Year: 2025).*
Korean Office Action dated Apr. 30, 2024 issued in corresponding Korean Appln. No. 10-2022-0186311, 7 pages, not in English.

* cited by examiner

*Primary Examiner* — Eric W Golightly
(74) *Attorney, Agent, or Firm* — Harness, Dickey & Pierce, P.L.C.

(57)               ABSTRACT

A substrate processing apparatus comprises a substrate support unit configured to support and rotate a substrate; and a spray unit including a nozzle structure and configured to discharge a substrate processing liquid onto the substrate using the nozzle structure. The nozzle structure comprises a first inlet pipe configured to provide a first chemical liquid; a second inlet pipe configured to provide a second chemical liquid; a reaction space module configured to mix the first chemical liquid and the second chemical liquid; and a discharge pipe configured to discharge a mixture solution of the first chemical liquid and the second chemical liquid into the substrate processing liquid. The first chemical liquid includes ozone gas, and the second chemical liquid includes an OH component.

18 Claims, 14 Drawing Sheets

SUBSTRATE PROCESSING APPARATUS AND METHOD THEREOF

This application claims the benefit of Korean Patent Application No. 10-2022-0186311, filed on Dec. 27, 2022, in the Korean Intellectual Property Office, the disclosure of which is incorporated herein by reference in its entirety.

BACKGROUND

1. Field

The present invention relates to a substrate processing apparatus and method including a spray unit. More specifically, it relates to a substrate processing apparatus and method applicable to a semiconductor manufacturing process, particularly a photolithography process.

2. Description of the Related Art

The semiconductor manufacturing process can be performed continuously within a semiconductor manufacturing equipment and can be divided into preprocess and postprocess. Here, the preprocess refers to the process of completing a semiconductor chip by forming a circuit pattern on a wafer, and the postprocess refers to the process of evaluating the performance of the product completed through the preprocess.

The semiconductor manufacturing equipment can be installed in a semiconductor manufacturing plant, defined as a fab, to manufacture semiconductors. The wafer is moved to the equipment where each process is performed to sequentially go through each process for producing a semiconductor, such as deposition process, photolithography process, etching process, ashing process, ion implantation process, cleaning process, packaging process, and inspection process.

In the photolithography process, exposure, development, and etching are sequentially performed on a substrate (e.g., wafer) using photoresist as a masking film. The photoresist on the substrate is removed because it is unnecessary after its use as a masking film is completed. Removal of photoresist is usually accomplished through a strip process.

In the strip process, photoresist can be removed using chemicals such as SPM (H2SO4+H2O2) and DSP (H2SO4+HF+H2O2). However, when using such a chemical to remove photoresist, the intermediate product (H2SO5) generated by the reaction of sulfuric acid and hydrogen peroxide is highly reactive and generates water, so the concentration of the chemical can be diluted. As a result, the removal efficiency of photoresist may be lowered, and as the amount of chemicals used increases, it may cause environmental problems such as increased wastewater volume and wastewater treatment costs.

SUMMARY

The technical problem to be solved by the present invention is to provide a substrate processing apparatus and method that can improve the removal efficiency of photoresist using an aqueous liquid containing ozone gas and an aqueous liquid containing OH components.

The technical objects of the present invention are not limited to the technical objects mentioned above, and other technical objects not mentioned will be clearly understood by those skilled in the art from the description below.

One aspect of the substrate processing apparatus of the present invention for achieving the above technical object comprises a substrate support unit for supporting and rotating a substrate; and a spray unit for discharging a substrate processing liquid onto the substrate using a nozzle structure, wherein the nozzle structure comprises a first inlet pipe for providing a first chemical liquid; a second inlet pipe for providing a second chemical liquid; a reaction space module where the first chemical liquid and the second chemical liquid are mixed; and a discharge pipe for discharging a mixture solution, in which the first chemical liquid is mixed with the second chemical liquid, into the substrate processing liquid, wherein the first chemical liquid contains ozone gas, and the second chemical liquid contains an OH component.

One aspect of the substrate processing method of the present invention for achieving the above technical object comprises providing a first chemical liquid containing ozone gas; providing a second chemical liquid containing an OH component; mixing the first chemical liquid and the second chemical liquid; and processing the substrate by providing a substrate processing liquid generated by the mixing to the substrate.

Another aspect of the substrate processing apparatus of the present invention for achieving the above technical object comprises a substrate support unit for supporting and rotating a substrate; and a spray unit for discharging a substrate processing liquid onto the substrate using a nozzle structure, wherein the nozzle structure comprises a first inlet pipe for providing a first chemical liquid; a second inlet pipe for providing a second chemical liquid; a reaction space module where the first chemical liquid and the second chemical liquid are mixed; and a discharge pipe for discharging a mixture solution of the first chemical liquid and the second chemical liquid into the substrate processing liquid, wherein the first chemical liquid is ozone water, in which ozone gas is mixed with pure water, and the second chemical liquid is an aqueous liquid containing an ammonia component, wherein the first chemical liquid and the second chemical liquid are provided simultaneously, and a flow rate of the first chemical liquid is greater than a flow rate of the second chemical liquid, wherein the second chemical liquid has a smaller flow rate and higher concentration than the first chemical liquid, wherein the reaction space modules is plural and arranged in a row.

Specific details of other embodiments are included in the detailed description and drawings.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
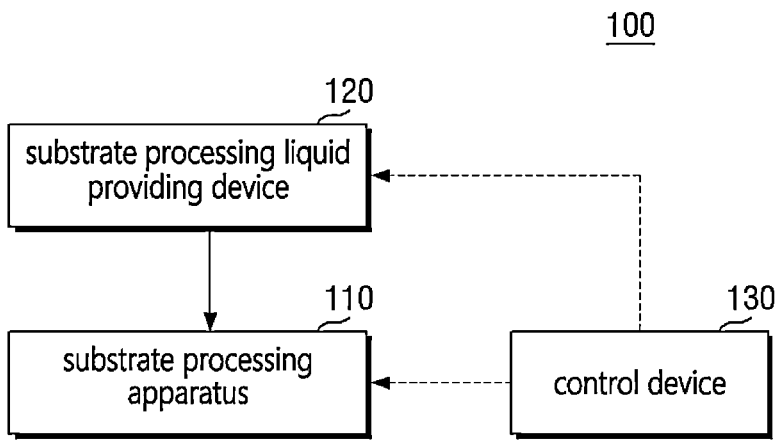
FIG. 1 is a block diagram showing the internal configuration of a substrate processing system used in a cleaning process.

Hereinafter, embodiments of the present invention will be described in detail with reference to the attached drawings. The same reference numerals are used for the same components in the drawings, and duplicate descriptions thereof are omitted.

The present invention relates to a substrate processing apparatus and method applicable to a semiconductor manufacturing process, particularly a photolithography process. The substrate processing apparatus of the present invention can achieve the effect of improving the removal efficiency of photoresist by using an aqueous liquid containing ozone gas (e.g., ozone water) and an aqueous liquid containing OH components (e.g., ammonia water). Hereinafter, the present invention will be described in detail with reference to the drawings.

FIG. 1 is a block diagram showing the internal configuration of a substrate processing system used in a cleaning process. According to FIG. 1, the substrate processing system 100 may comprise a substrate processing apparatus 110, a substrate processing liquid providing device 120, and a control device (controller) 130.

The substrate processing apparatus 110 is an apparatus that processes a substrate using a chemical liquid. The substrate processing apparatus 110 may remove photoresist from the substrate using a chemical liquid. The substrate processing apparatus 110 may be provided as a cleaning process chamber that cleans the substrate using a chemical liquid.

The chemical liquid may be a substance in a liquid state (for example, an organic solvent) or a substance in a gaseous state. Chemical liquids are highly volatile and may contain substances that generate a lot of fume or have high viscosity and thus high residual properties. Chemical liquids may be selected from, for example, a material containing IPA (Iso-Propyl Alcohol) component, a material containing sulfuric acid component (e.g., SPM containing sulfuric acid and hydrogen peroxide component), a material containing ammonia water component (e.g., SC-1($H_2O_2$+$NH_4$ OH), a material containing a hydrofluoric acid component (e.g., DHF (Diluted Hydrogen Fluoride)), a material containing a phosphoric acid component, etc. Hereinafter, these chemical liquids used for processing the substrate will be defined as substrate processing liquids.

When applied to a cleaning process as described above, the substrate processing apparatus 110 may rotate the substrate using a spin head and provide a chemical liquid on the substrate using a nozzle. When the substrate processing apparatus 110 is provided as a liquid processing chamber in this way, as shown in FIG. 2, it may comprise a substrate support unit 210, a processing liquid recovery unit 220, an elevation unit 230, and a spray unit 240.

Figure 2:
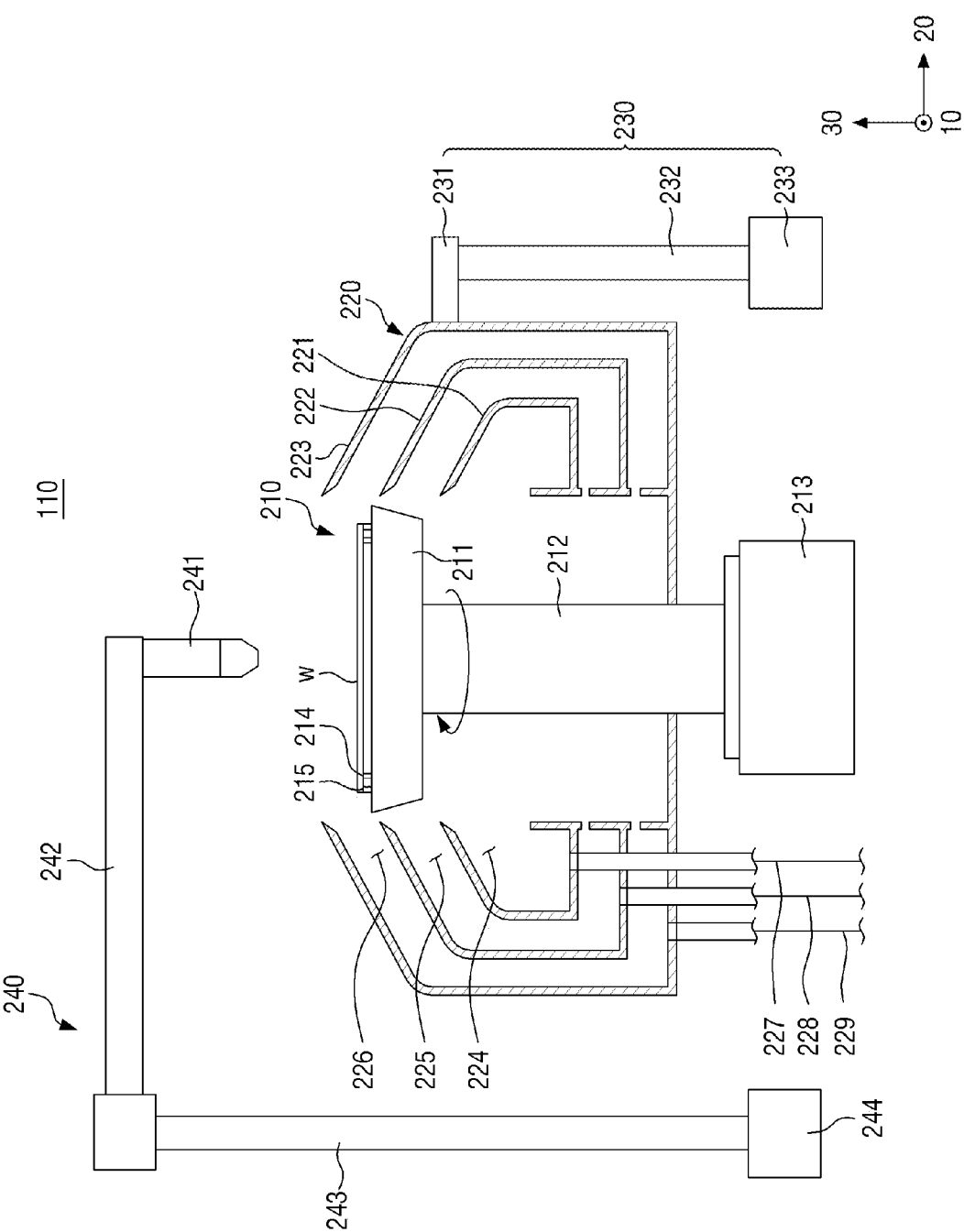
FIG. 2 is an exemplary diagram schematically showing the internal structure of a substrate processing apparatus used in a cleaning process.

FIG. 2 is an exemplary diagram schematically showing the internal structure of a substrate processing apparatus used in a cleaning process. The following description refers to FIG. 2.

The substrate support unit 210 is a module that supports the substrate W. When processing the substrate W, the substrate support unit 210 may rotate the substrate W in a direction perpendicular to the third direction 30 (first direction 10 and second direction 20). The substrate support unit 210 may be disposed inside the processing liquid recovery unit 220 to recover the substrate processing liquid used when processing the substrate W.

The substrate support unit 210 may comprise a spin head 211, a rotation axis 212, a rotation driving module 213, a support pin 214, and a guide pin 215.

The spin head 211 rotates along the rotation direction of the rotation axis 212 (a direction perpendicular to the third direction 30). This spin head 211 may be provided to have the same shape as the substrate W. However, this embodiment is not limited to this. The spin head 211 may be provided to have a shape different from that of the substrate W.

The rotation shaft 212 generates rotation force using energy provided from the rotation driving module 213. This rotation shaft 212 is coupled to the rotation driving module 213 and the spin head 211, respectively, and can transmit the rotation force generated by the rotation driving module 213 to the spin head 211. The spin head 211 rotates along the rotation axis 212, and in this case, the substrate W seated on the spin head 211 may also rotate together with the spin head 211.

The support pin 214 and guide pin 215 fix the position of the substrate W on the spin head 211. For this purpose, the support pin 214 supports the bottom surface of the substrate W on the spin head 211, and the guide pin 215 supports the side surface of the substrate W. A plurality of support pins 214 and guide pins 215 may be installed on the spin head 211, respectively.

The support pin 214 may be arranged to have an overall annular ring shape. The support pin 214 can support the bottom surface of the substrate W so that the substrate W can be spaced a certain distance from the top of the spin head 211.

The guide pin 215 is a chucking pin and can support the substrate W so that the substrate W does not deviate from its original position when the spin head 211 rotates.

The processing liquid recovery unit 220 recovers the substrate processing liquid used to process the substrate W. The processing liquid recovery unit 220 may be installed to surround the substrate support unit 210, thereby providing a space where a processing process for the substrate W is performed.

After the substrate W is seated and fixed on the substrate support unit 210 and begins to rotate by the substrate support unit 210, the spray unit 240 may spray the substrate processing liquid on the substrate W according to the control of the control device 130. Then, the substrate processing liquid discharged on the substrate W may be dispersed in the direction where the processing liquid recovery unit 220 is located due to the centrifugal force generated by the rotation force of the substrate support unit 210. In this case, the processing liquid recovery unit 220 may recover the substrate processing liquid when the substrate processing liquid flows through the inlet (that is, the first opening unit 224 of the first recovery container 221, the second opening unit 225 of the second recovery container 222, the third opening unit 226 of the third recovery container 223, etc., which will be described later) into its inside.

The processing liquid recovery unit 220 may be configured to include a plurality of recovery containers. The processing liquid recovery unit 220 may be configured to include, for example, three recovery containers. When the processing liquid recovery unit 220 is configured to include a plurality of recovery containers as described above, the substrate processing liquid used in the substrate processing process can be separated and recovered using the plurality of recovery containers, and thus the recycling of the substrate processing liquid may become possible.

When the processing liquid recovery unit 220 is configured to include three recovery containers, it may include a first recovery container 221, a second recovery container 222, and a third recovery container 223. The first recovery container 221, the second recovery container 222, and the third recovery container 223 may be implemented as a bowl, for example.

The first recovery container 221, the second recovery container 222, and the third recovery container 223 may recover different substrate processing liquids. For example, the first recovery container 221 can recover a rinse liquid (e.g., DI Water (Deionized Water)), the second recovery container 222 can recover the first chemical liquid, and the third recovery container 222 can recover the second chemical liquid.

The first recovery container 221, the second recovery container 222, and the third recovery container 223 can be connected to recovery lines 227, 228, 229 extending from their bottom surfaces in a downward direction (third direction 30). The first processing liquid, second processing liquid, and third processing liquid recovered through the first recovery container 221, the second recovery container 222, and the third recovery container 223 can be processed for reuse through a processing liquid regeneration system (not shown).

The first recovery container 221, the second recovery container 222, and the third recovery container 223 may be provided in an annular ring shape surrounding the substrate support unit 210. The sizes of the first recovery container 221, the second recovery container 222, and the third recovery container 223 may increase as it moves from the first recovery container 221 to the third recovery container 223 (i.e., in the second direction 20). The gap between the first recovery container 221 and the second recovery container 222 is defined as the first gap, and the gap between the second recovery container 222 and the third recovery container 223 is defined as the second gap. Then, the first gap may be equal to the second gap. However, this embodiment is not limited to this. The first gap may be different from the second gap. That is, the first gap may be larger than the second gap, or may be smaller than the second gap.

The elevation unit 230 moves the processing liquid recovery unit 220 in a straight line in the vertical direction (third direction 30). The elevation unit 230 may serve to adjust the relative height of the processing liquid recovery unit 220 with respect to the substrate support unit 210 (or the substrate W).

The elevation unit 230 may include a bracket 231, a first support shaft 232, and a first driving module 233.

The bracket 231 is fixed to the outer wall of the processing liquid recovery unit 220. The bracket 231 may be coupled to the first support shaft 232 moved in the vertical direction by the first driving module 233.

When seating the substrate W on the substrate support unit 210, the substrate support unit 210 may be located higher than the processing liquid recovery unit 220. Likewise, even when detaching the substrate W from the substrate support unit 210, the substrate support unit 210 may be located higher than the processing liquid recovery unit 220. In the above case, the elevation unit 230 may serve to lower the processing liquid recovery unit 220.

When a processing process for the substrate W is in progress, depending on the type of substrate processing liquid discharged on the substrate W, the processing liquid may be recovered into any one of the first recovery container 221, the second recovery container 222, and the third recovery container 222. Even in this case, the elevation unit 230 may serve to raise and lower the processing liquid recovery unit 220 to the corresponding position. For example, when using the first processing liquid as the substrate processing liquid, the elevation unit 230 may raise and lower the processing liquid recovery unit 220 so that the substrate W is located at a height corresponding to the first opening unit 224 of the first recovery container 221.

Meanwhile, in this embodiment, the elevation unit 230 also may move the substrate support unit 210 220 in a straight line in the vertical direction to adjust the relative height of the processing liquid recovery unit 220 with respect to the substrate support unit 210 (or substrate W).

However, this embodiment is not limited to this. The elevation unit 230 may also simultaneously move the substrate support unit 210 and the processing liquid recovery unit 220 in a straight line in the vertical direction to adjust the relative height of the processing liquid recovery unit 220 relative to the substrate support unit 210 (or the substrate W).

The spray unit 240 is a module that supplies substrate processing liquid onto the substrate W when processing the substrate W. At least one such spray unit 240 may be installed within the substrate processing unit 120. When a plurality of spray units 240 are installed in the substrate processing unit 120, each spray unit 240 may spray different substrate processing liquids on the substrate W.

The spray unit 240 may include a nozzle structure 241, a nozzle support module 242, a second support shaft 243, and a second driving module 244.

The nozzle structure 241 is installed at the end of the nozzle support module 242. This nozzle structure 241 can be moved to a process position or a standby position by the second driving module 244.

In the above, the process position refers to the upper area of the substrate W, and the standby position refers to the remaining area excluding the process position. The nozzle structure 241 may be moved to the process position when discharging the substrate processing liquid on the substrate W, and after discharging the substrate processing liquid on the substrate W, it may leave the process position and move to the standby position.

The nozzle support module 242 supports the nozzle structure 241. This nozzle support module 242 may be formed to extend in a direction corresponding to the longitudinal direction of the spin head 211. That is, the nozzle support module 242 may be provided so that its longitudinal direction is along the second direction 20.

The nozzle support module 242 may be coupled to a second support shaft 243 extending in a direction perpendicular to the longitudinal direction. The second support shaft 243 may extend in a direction corresponding to the height direction of the spin head 211. That is, the second support shaft 243 may be provided so that its longitudinal direction is along the third direction 30.

The second driving module 244 is a module that rotates and elevates the second support shaft 243 and the nozzle support module 242 interworked to the second support shaft 243. According to this function of the second driving module 244, the nozzle structure 241 can be moved to the process position or the standby position.

Description will be made again with reference to FIG. 1.

The substrate processing liquid providing device 120 is a device that provides substrate processing liquid to the substrate processing apparatus 110. For this purpose, the substrate processing liquid providing device 120 may be connected to the spray unit 240 of the substrate processing apparatus 110 and may operate under the control of the control device 130.

The control device 130 is a device that controls the operation of the substrate processing apparatus 110. Specifically, the control device 130 may control the operation of a rotation driving module 213 of the substrate support unit 210, a first driving module 233 of the elevation unit 230, and a second driving module 244 of the spray unit 240.

The control device 130 may comprise a process controller consisting of a microprocessor (computer) that controls the substrate processing apparatus 110, a user interface consisting of a keyboard that allow an operator to perform a command input manipulations to manage the substrate processing apparatus 110 and a display that visualizes and displays the operating status of the substrate processing apparatus 110, a control program for executing the processing performed in the substrate processing apparatus 110 under the control of the process controller, and a memory unit, in which a program for executing processing according to various data and processing conditions in each component, that is, a processing recipe, is stored. Additionally, the user interface and memory unit may be connected to the process controller. The processing recipe may be stored in a memory medium in the memory unit, and the memory medium may be a hard disk, a portable disk such as a CD-ROM or DVD, or a semiconductor memory such as a flash memory.

Meanwhile, the control device 130 may also control the operation of the substrate processing liquid providing device 120 so that the substrate processing liquid is supplied from the substrate processing liquid providing device 120 to the substrate processing apparatus 110 when necessary.

As described above, in this embodiment, the photoresist removal efficiency on the substrate W can be increased by using ozone water as the first chemical liquid and ammonia water as the second chemical liquid. In this embodiment, an aqueous liquid containing OH ions, that is, an alkaline solution, may be used as the second chemical liquid for reaction with the first chemical liquid. Hereinafter, ammonia water will be described as an example of the second chemical liquid.

Figure 3:
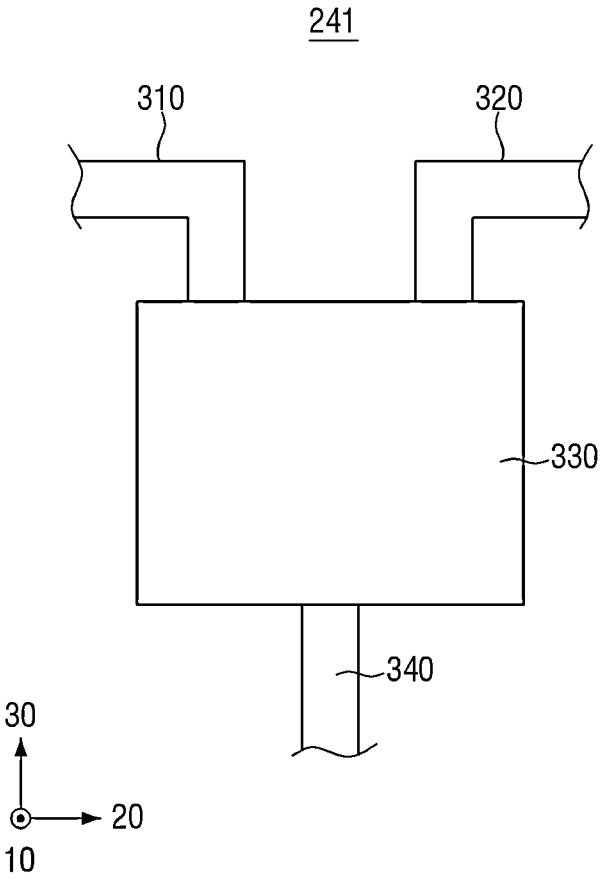
FIG. 3 is a first example diagram schematically showing the internal structure of a nozzle structure constituting a spray unit in a substrate processing apparatus.

FIG. 3 is a first example diagram schematically showing the internal structure of a nozzle structure constituting a spray unit in a substrate processing apparatus. According to FIG. 3, the nozzle structure 241 may be configured to include a first inlet pipe 310, a second inlet pipe 320, a reaction space module 330, and a discharge pipe 340.

The nozzle structure 241 may discharge chemicals onto the substrate W when photoresist is removed from the substrate W. The chemicals may include ozone water and ammonia water.

The first inlet pipe 310 provides a path for introducing a solution, in which ozone gas is dissolved, into the reaction space module 330. For example, the first inlet pipe 310 may introduce ozone water into the reaction space module 330. In the above, ozone water may be a mixed solution of ozone gas and water. Preferably, the ozone water may be a mixed solution (O3DIW) of ozone (O3) gas and de-ionized water (DIW). Although not shown in FIG. 3, the first inlet pipe 310 may be connected to an ozone water supply device to provide ozone water.

The second inlet pipe 320 provides a path for introducing a solution in which the ammonia component is dissolved into the reaction space module 330. For example, the second inlet pipe 320 may introduce ammonia water (NH4OH) into the reaction space module 330. Although not shown in FIG. 3, the second inlet pipe 320 may be connected to an ammonia water supply device to provide ammonia water. The ammonia water supply device may be provided in the substrate processing liquid providing device 120 along with the ozone water supply device.

Figure 4:
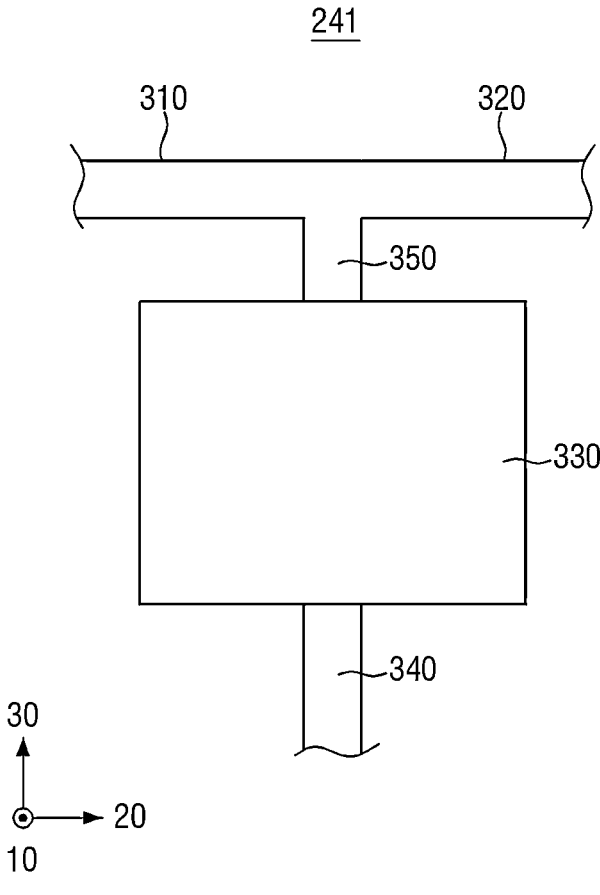
FIG. 4 is a first example diagram for explaining various embodiments of an inlet pipe constituting a nozzle structure.

The first inlet pipe 310 and the second inlet pipe 320 may be respectively connected to the reaction space module 330. Accordingly, the ozone water provided through the first inlet pipe 310 may first contact the ammonia water provided through the second inlet pipe 320 inside the reaction space module 330. However, it is not limited to this, and in this embodiment, it is also possible that ozone water and ammonia water are provided to contact each other before flowing into the interior of the reaction space module 330. In this case, the nozzle structure 241 may further include a third inlet pipe 350 as shown in the example of FIG. 4.

The third inlet pipe 350 may be connected to the reaction space module 330 through one end. Additionally, the third inlet pipe 350 may be connected to the first inlet pipe 310 and the second inlet pipe 320 through the other end. The first inlet pipe 310 and the second inlet pipe 320 may branch from the other end of the third inlet pipe 350. FIG. 4 is a first example diagram for explaining various embodiments of an inlet pipe constituting a nozzle structure.

Figure 5:
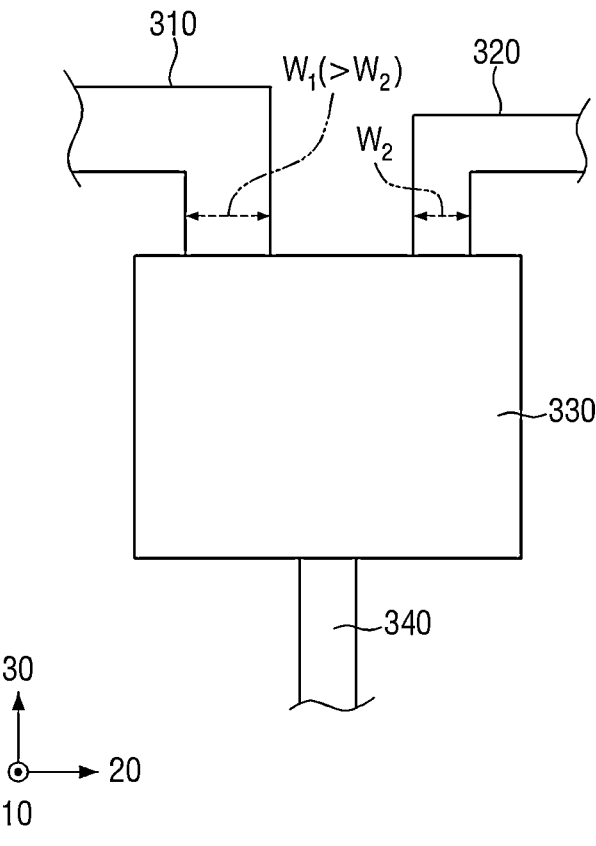
FIG. 5 is a second example diagram for explaining various embodiments of the inlet pipe constituting the nozzle structure.

Ozone water and ammonia water can be mixed within the reaction space module 330. Ozone water and ammonia water can be simultaneously supplied to the reaction space module 330 for this purpose. However, in a chemical mixture of ozone water and ammonia water, the amount of ammonia water may be small compared to the ozone water. Taking this aspect into consideration, the first inlet pipe 310 may be provided to have a larger width than the second inlet pipe 320. That is, the width $W_1$ of the first inlet pipe 310 may be larger than the width $W_2$ of the second inlet pipe 320, as shown in the example of FIG. 5 ($W_1 > W_2$). FIG. 5 is a second example diagram for explaining various embodiments of an inlet pipe constituting a nozzle structure.

Figure 6:
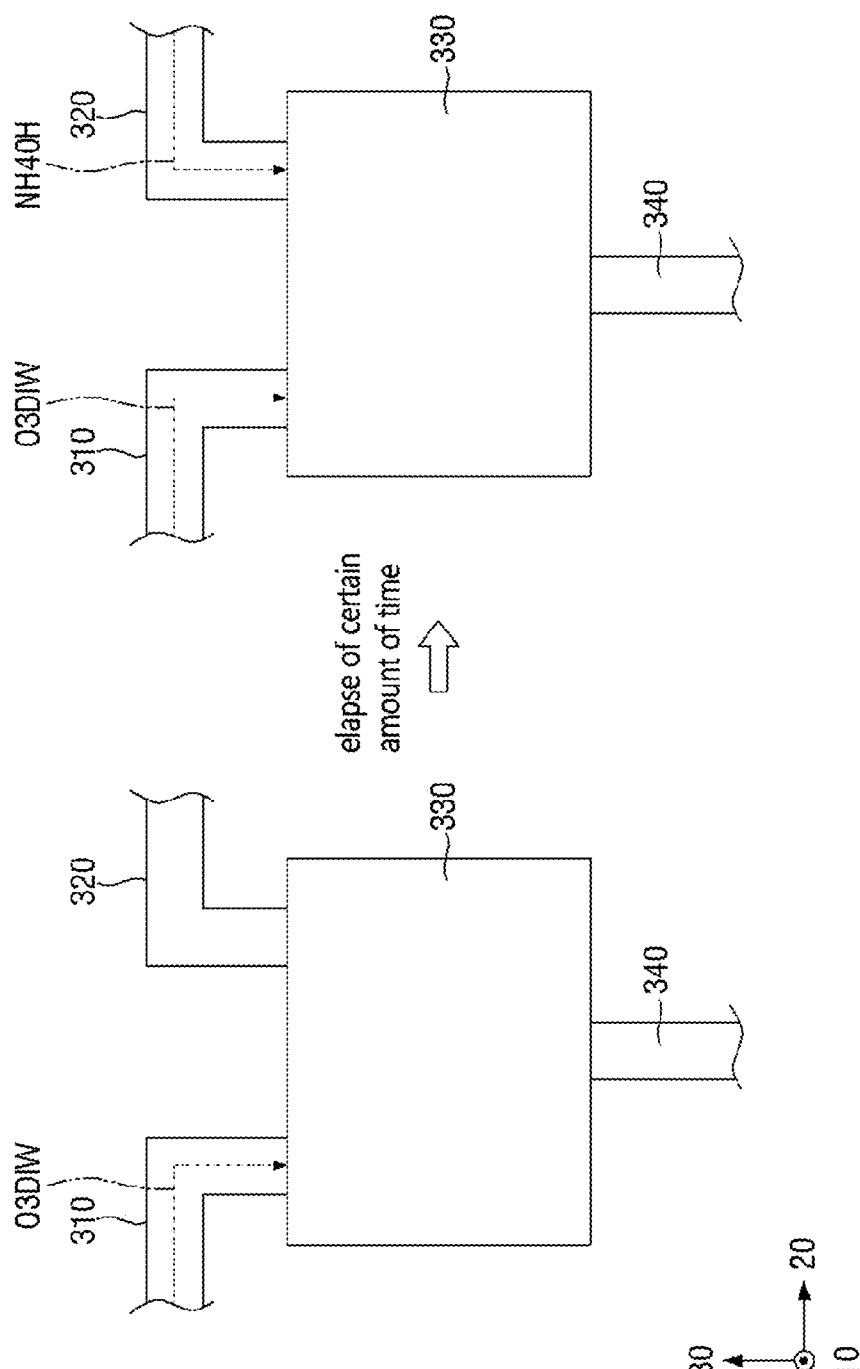
FIG. 6 is a third example diagram for explaining various embodiments of the inlet pipe constituting the nozzle structure.

In order to mix a large amount of ozone water with a small amount of ammonia water, it is also possible to supply the ozone water to the reaction space module 330 before the ammonia water. That is, as shown in the example of FIG. 6, ozone water is first supplied to the reaction space module 330 through the first inlet pipe 310, and after a predetermined time has elapsed, it is also possible to simultaneously supply ozone water and ammonia water to the reaction space module 330 through the first inlet pipe 310 and the second inlet pipe 320. In this case, the width $W_1$ of the first inlet pipe 310 may be the same as the width $W_2$ of the second inflow pipe 320 ($W_1 \geq W_2$). FIG. 6 is a third example diagram for explaining various embodiments of the inlet pipe constituting the nozzle structure.

Additionally, it is possible to vary the length of time for which ozone water is provided and the length of time for which ammonia water is provided. That is, the length of time for which ozone water is provided can be made longer than the length of time for which ammonia water is provided, so that a large amount of ozone water can be mixed with a small amount of ammonia water. In this case as well, the width $W_1$ of the first inlet pipe 310 may be the same as the width $W_2$ of the second inflow pipe 320 ($W_1 \geq W_2$).

Meanwhile, in this embodiment, it is also possible to provide a large amount of ozone water to be mixed with a small amount of ammonia water through flow rate control. In this case, the control device 130 can control the flow rates of ozone water and ammonia water by increasing the flow rate of ozone water provided to the reaction space module 330 through the first inlet pipe 310 and decreasing the flow rate of the ammonia water provided to the reaction space module 330 through the second inlet pipe 320.

If the amount of ammonia is excessive, the ammonia may react with ozone, and accordingly, the reaction between the photoresist and ammonia may not occur. Therefore, the amount of ammonia water may be small compared to ozone water. Preferably, the flow rate of ammonia water may be in the range of 2% to 20% compared to the flow rate of ozone water.

Ammonia water can have a higher concentration than ozone water. The concentration of ammonia water may be 5 to 20 times that of ozone water. In this embodiment, the ozone water provided to the reaction space module 330 through the first inlet pipe 310 may have a flow rate of 1500 ml/min to 2000 ml/min and a concentration of 80 ppm to 120 ppm. And the ammonia water provided to the reaction space module 330 through the second inlet pipe 320 may have a flow rate of 50 ml/min to 200 ml/min and a concentration of 800 ppm to 1000 ppm.

Description will be made again with reference to FIG. 3.

The reaction space module 330 provides a space so that the ozone water provided through the first inlet pipe 310 and the ammonia water provided through the second inlet pipe 320 can be mixed. The reaction space module 330 may be provided in singular, but is not limited to this and may also be provided in plural.

Figure 7:
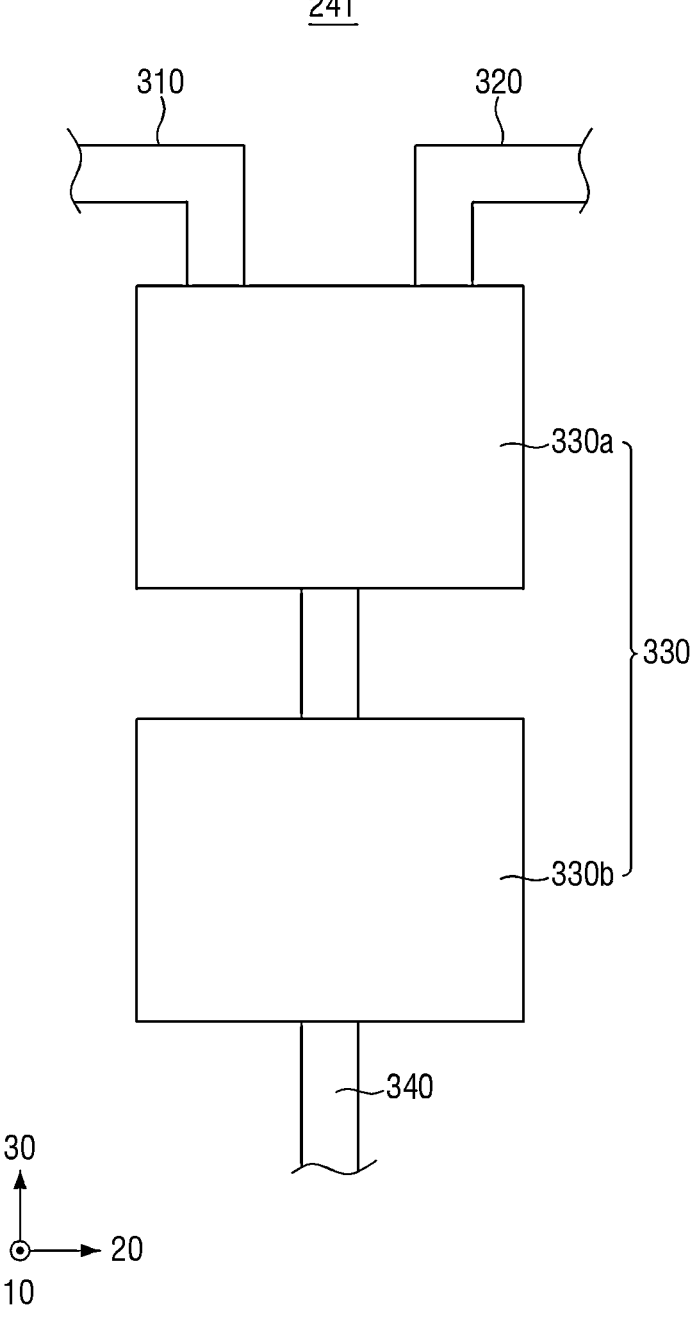
FIG. 7 is a first example diagram for explaining various embodiments of the reaction space constituting the nozzle structure.

When a plurality of reaction space modules 330 are provided, the plurality of reaction space modules 330 may be arranged in a row. For example, when the first reaction space 330a and the second reaction space 330b are provided in the nozzle structure 241, as shown in the example of FIG. 7, the first reaction space 330a may be disposed at the upper part and connected to the first inlet pipe 310 and the second inlet pipe 320, and the second reaction space 330b may be disposed at the lower part and connected to the discharge pipe 340. FIG. 7 is a first example diagram for explaining various embodiments of the reaction space constituting the nozzle structure.

Figure 8:
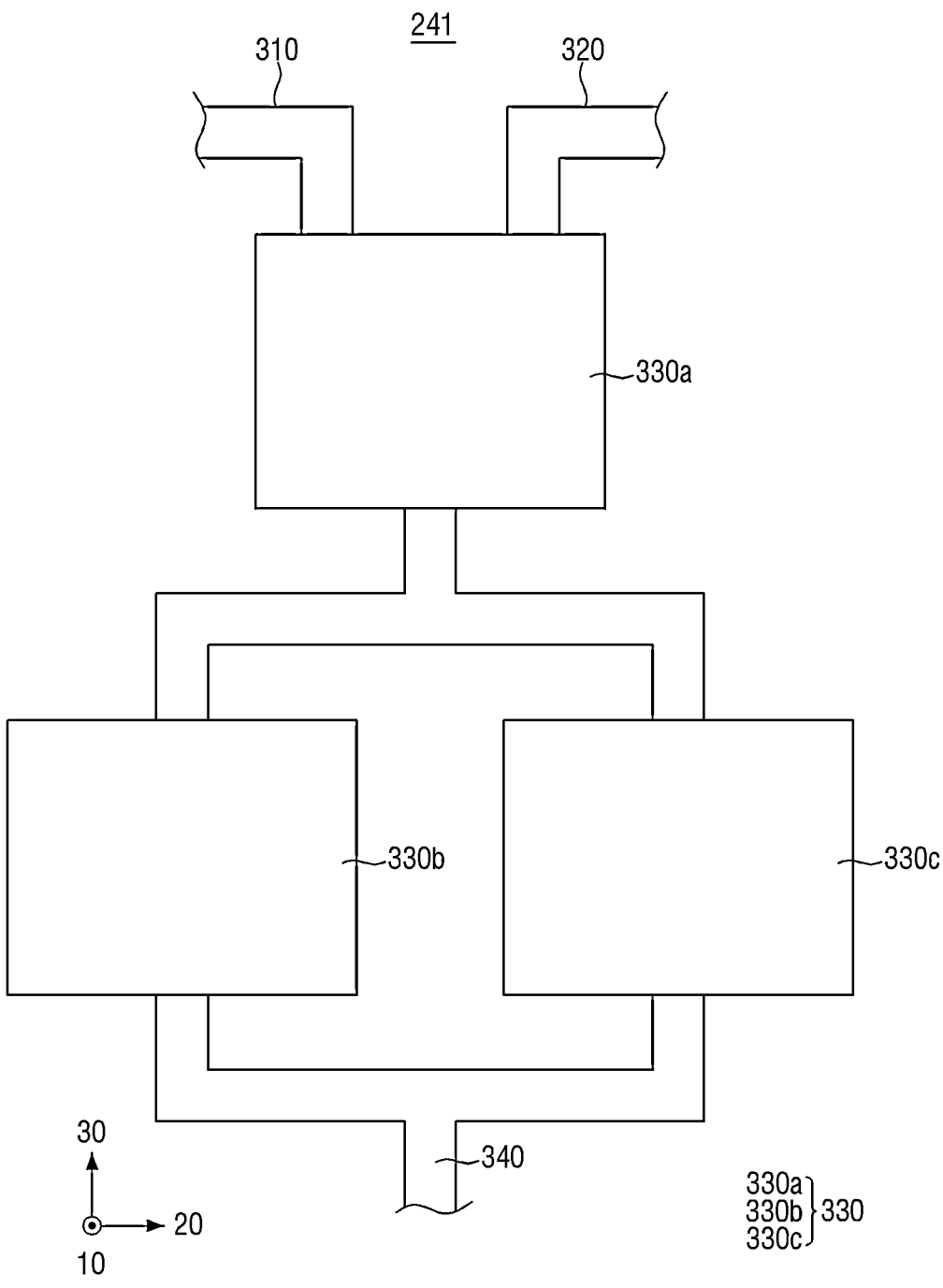
FIG. 8 is a second example diagram for explaining various embodiments of the reaction space constituting the nozzle structure.

However, this embodiment is not limited to this. When a plurality of reaction space modules 330 are provided, some reaction space modules 330 among the plurality of reaction space modules 330 may be arranged in series and other reaction space modules 330 may be arranged in parallel. Alternatively, it is possible for all of the plurality of reaction space modules 330 to be arranged in parallel. For example, when the first reaction space 330a, the second reaction space 330b, and the third reaction space 330c are provided in the nozzle structure 241, as shown in the example of FIG. 8, the second reaction space 330b and the third reaction space 330c may be arranged in parallel, and the first reaction space 330a may be arranged in series with respect to the second reaction space 330b and the third reaction space 330c. FIG. 8 is a second example diagram for explaining various embodiments of the reaction space constituting the nozzle structure.

When ozone water and ammonia water are mixed, a large amount of reactive gas may be generated due to the mixing. When the reaction space module 330 is provided in singular, the reaction time between ozone water and ammonia water is short until ozone water and ammonia water is mixed and the mixed solution is discharged onto the substrate W through the discharge pipe 340, so a large amount of reactive gas may be transferred onto the substrate W. On the other hand, if a plurality of reaction space modules 330 are provided, the reaction time between ozone water and ammonia water becomes sufficiently long, and the mixed solution can be provided on the substrate W after the reaction between ozone water and ammonia water is completed. If a plurality of reaction space modules 330 are provided, the processing efficiency (i.e., photoresist removal efficiency) of the substrate W can be improved.

Figure 9:
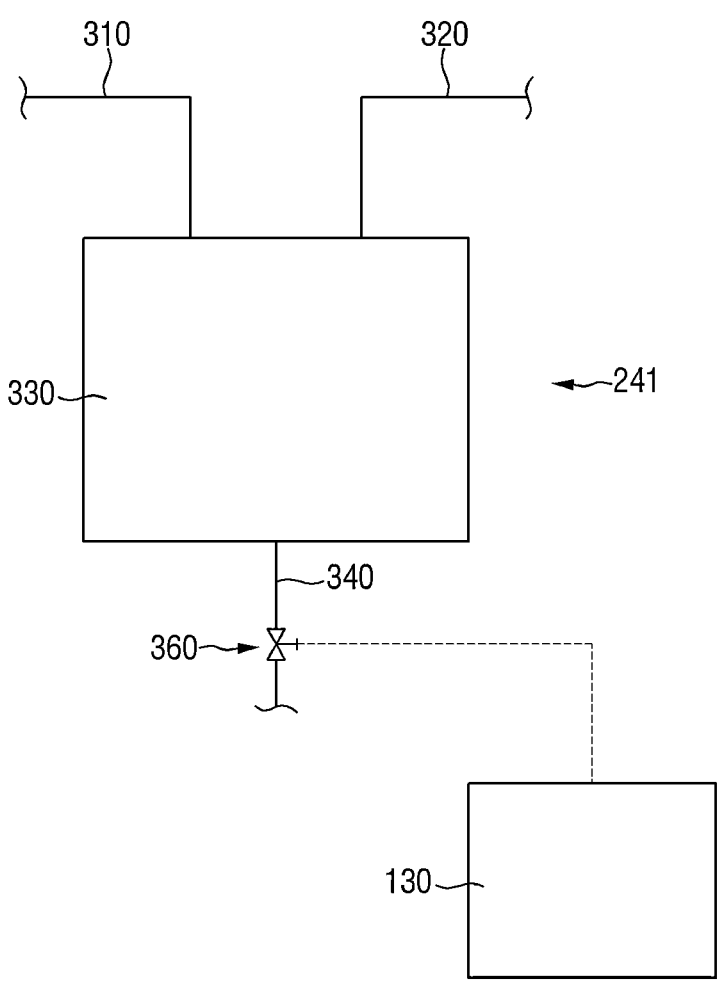
FIG. 9 is a second example diagram schematically showing the internal structure of a nozzle structure constituting a spray unit in a substrate processing apparatus.

When the reaction space module 330 is provided in singular, an open/close valve 360 may be installed in the discharge pipe 340 as shown in the example of FIG. 9 to ensure sufficient reaction time between ozone water and ammonia water. The open/close valve 360 may be opened or closed under the control of the control device 130 to delay the time at which the mixed solution of ozone water and ammonia water is discharged onto the substrate W after it is provided to the reaction space module 330. The open/close valve 360 may be provided in singular, but is not limited to this and may be provided in plural. FIG. 9 is a second example diagram schematically showing the internal structure of a nozzle structure constituting a spray unit in a substrate processing apparatus.

The nozzle structure 241 may include an open/close valve 360 even when a plurality of reaction space modules 330 are provided. In this case, the open/close valve 360 may be installed in the discharge pipe 340, but is not limited to this and may also be installed on a pipe connecting two different reaction space modules. For example, the open/close valve 360 may be installed on a pipe connecting the first reaction space 330a and the second reaction space 330b described through the example of FIG. 7.

Figure 10:
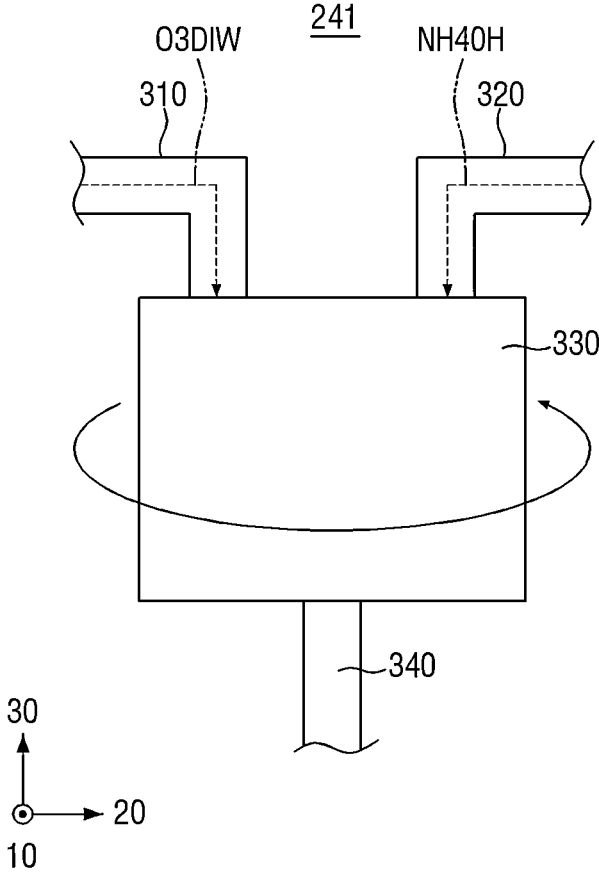
FIG. 10 is a third example diagram for explaining various embodiments of the reaction space constituting the nozzle structure.

When the reaction space module 330 is provided in singular, the reaction space module 330 may be rotated as shown in the example of FIG. 10 to increase the reaction speed of ozone water and ammonia water. When ozone water and ammonia water begin to be provided through the first inlet pipe 310 and the second inlet pipe 320, the reaction space module 330 may rotate clockwise or counterclockwise to promote the reaction between ozone water and ammonia water. FIG. 10 is a third example diagram for explaining various embodiments of the reaction space constituting the nozzle structure.

Description will be made again with reference to FIG. 3.

The discharge pipe 340 provides a path for discharging the mixed solution when ozone water and ammonia water are mixed in the reaction space module 330. Although not shown in FIG. 3, the discharge pipe 340 is connected to the discharge port of the nozzle structure 241, and the mixed solution of ozone water and ammonia water is discharged onto the substrate W through the discharge port.

Figure 11:
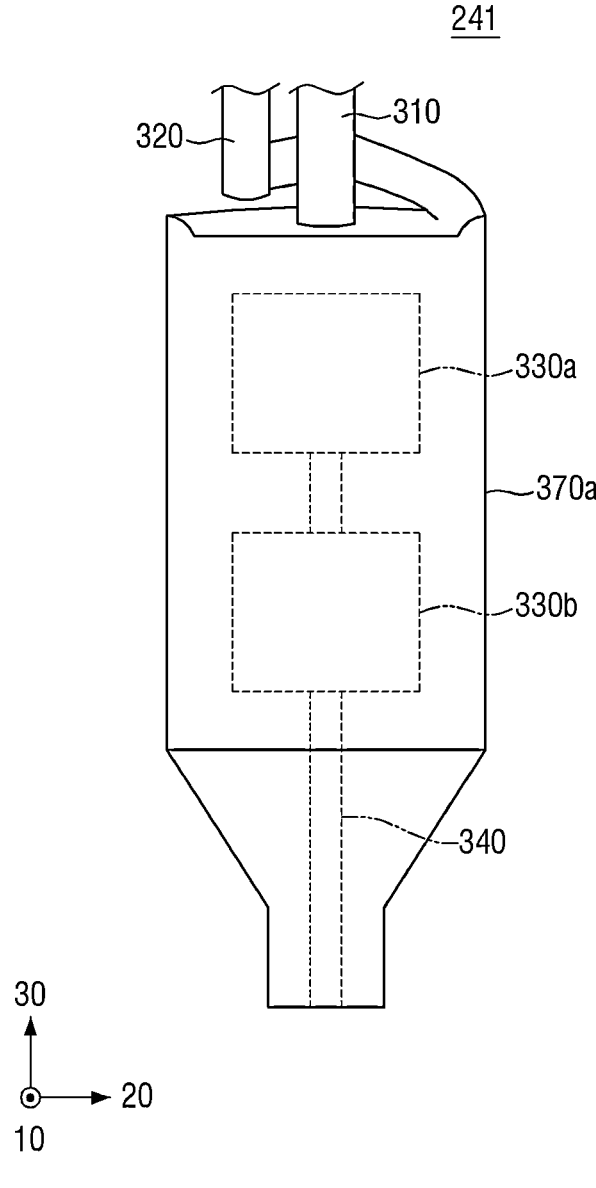
FIG. 11 is a first example diagram schematically showing the external appearance and internal structure of a nozzle structure constituting a spray unit in a substrate processing apparatus.

The first reaction space 330a, the second reaction space 330b, the discharge pipe 340, etc. may be installed in a single housing 370a as shown in the example of FIG. 11. The single housing 370a may have a shape whose width narrows downward toward where the discharge pipe 340 is installed inside. FIG. 11 is a first example diagram schematically showing the external appearance and internal structure of a nozzle structure constituting a spray unit in a substrate processing apparatus.

Figure 12:
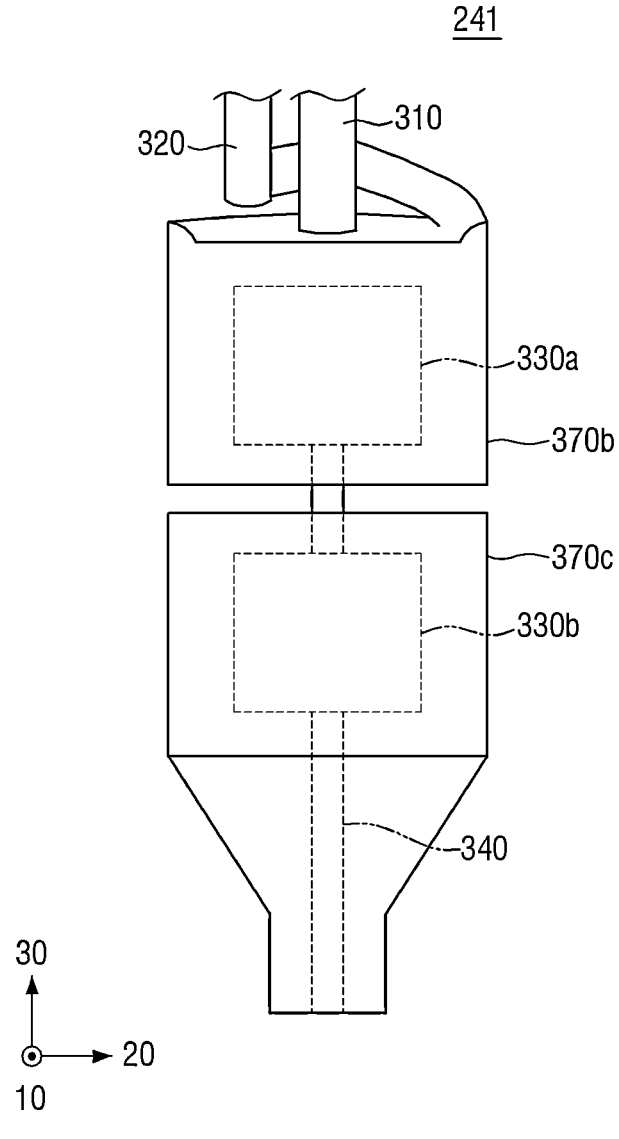
FIG. 12 is a second example diagram schematically showing the external appearance and internal structure of a nozzle structure constituting a spray unit in a substrate processing apparatus.

However, it is not limited to this, and the first reaction space 330a, the second reaction space 330b, the discharge pipe 340, etc. can also be installed in the separate housings 370b and 370c as shown in the example of FIG. 12. The separate housings 370a and 370b can be divided into an upper housing 370a and a lower housing 370b. In this case, the first reaction space 330a may be installed in the upper housing 370a, and the second reaction space 330b and the discharge pipe 340 may be installed in the lower housing 370b. FIG. 12 is a second example diagram schematically showing the external appearance and internal structure of a nozzle structure constituting a spray unit in a substrate processing apparatus.

As described above, the number of reaction space modules 330 is not limited to two and may be provided with one, or three or more. In this case, a single housing 370a or a detachable housing including a plurality of housings arranged in the vertical direction can be applied.

In addition, in the example of FIG. 3, both the first inlet pipe 310 and the second inlet pipe 320 are described as being connected to the upper part of the reaction space module 330, but this is not limited to this and as shown in the example of FIGS. 11 and 12, the first inlet pipe 310 may be vertically connected to the upper part of the reaction space module 330, and the second inlet pipe 320 may be connected to the side along the circumference of the reaction space module 330. In this case, the ammonia water flowing in through the second inlet pipe 320 rotates within the reaction space module 330, which may contribute to promoting the reaction with ozone water.

Alternatively, although not shown in FIGS. 11 and 12, the second inlet pipe 320 may be vertically connected to the upper part of the reaction space module 330, and the first inlet pipe 310 may be connected to the side along the circumference of the reaction space module 330. In this case, the ozone water flowing in through the first inlet pipe 310 rotates within the reaction space module 330 and may contribute to promoting the reaction with ammonia water.

Figure 13:
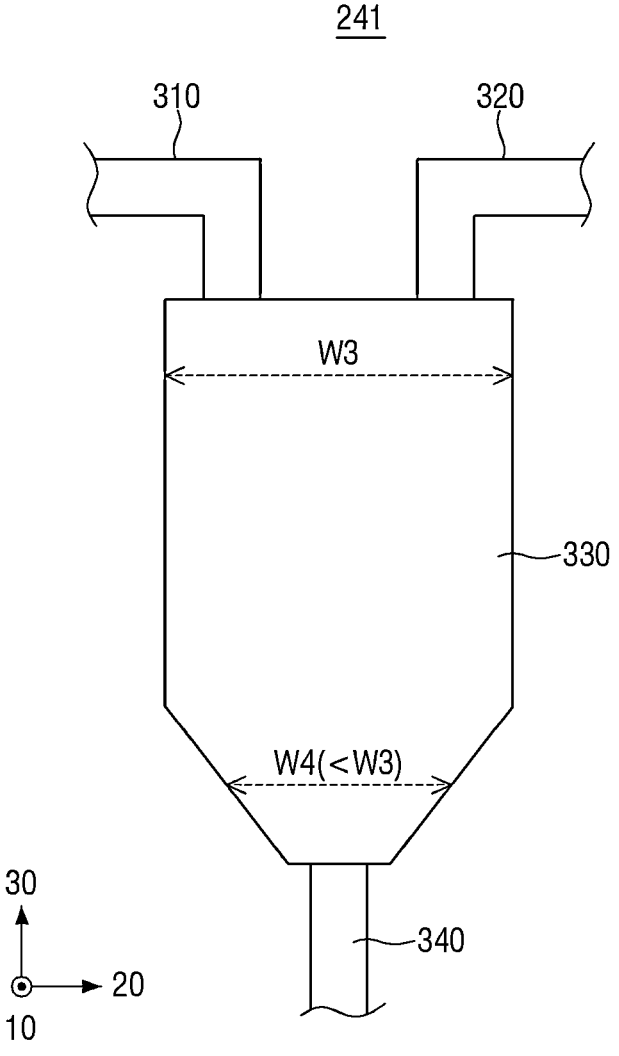
FIG. 13 is a fourth exemplary diagram for explaining various embodiments of the reaction space constituting the nozzle structure.

Meanwhile, the reaction space module 330 may have an upper width ($w_3$) and a lower width ($w_4$) of the same or similar shape, such as a cylinder, elliptical column, or polygonal column. However, it is not limited to this, and the reaction space module 330 may have the upper width ($w_3$) and the lower width ($w_4$) of different shapes, such as a cone, an elliptical cone, or a polygonal pyramid. For example, the reaction space module 330 may have a shape where the upper width ($w_3$) is wider than the lower width ($w_4$), as shown in the example of FIG. 13. FIG. 13 is a fourth exemplary diagram for explaining various embodiments of the reaction space constituting the nozzle structure.

With reference to FIGS. 3 to 13, a nozzle mixing structure capable of mixing ozone water and ammonia water for photoresist peeling was described. In this embodiment, in order to peel off the photoresist on the substrate W, ammonia water is added to a solution in which ozone gas is dissolved (i.e., ozone water), and the mixed solution can be used to process the substrate W. In this embodiment, the photoresist removal efficiency can be increased by simultaneously providing ozone water and ammonia water to the reaction space module 330, and the ozone water and ammonia water can be mixed at the nozzle discharge end to enable effective removal of photoresist. Below, this method will be described in detail.

Figure 14:
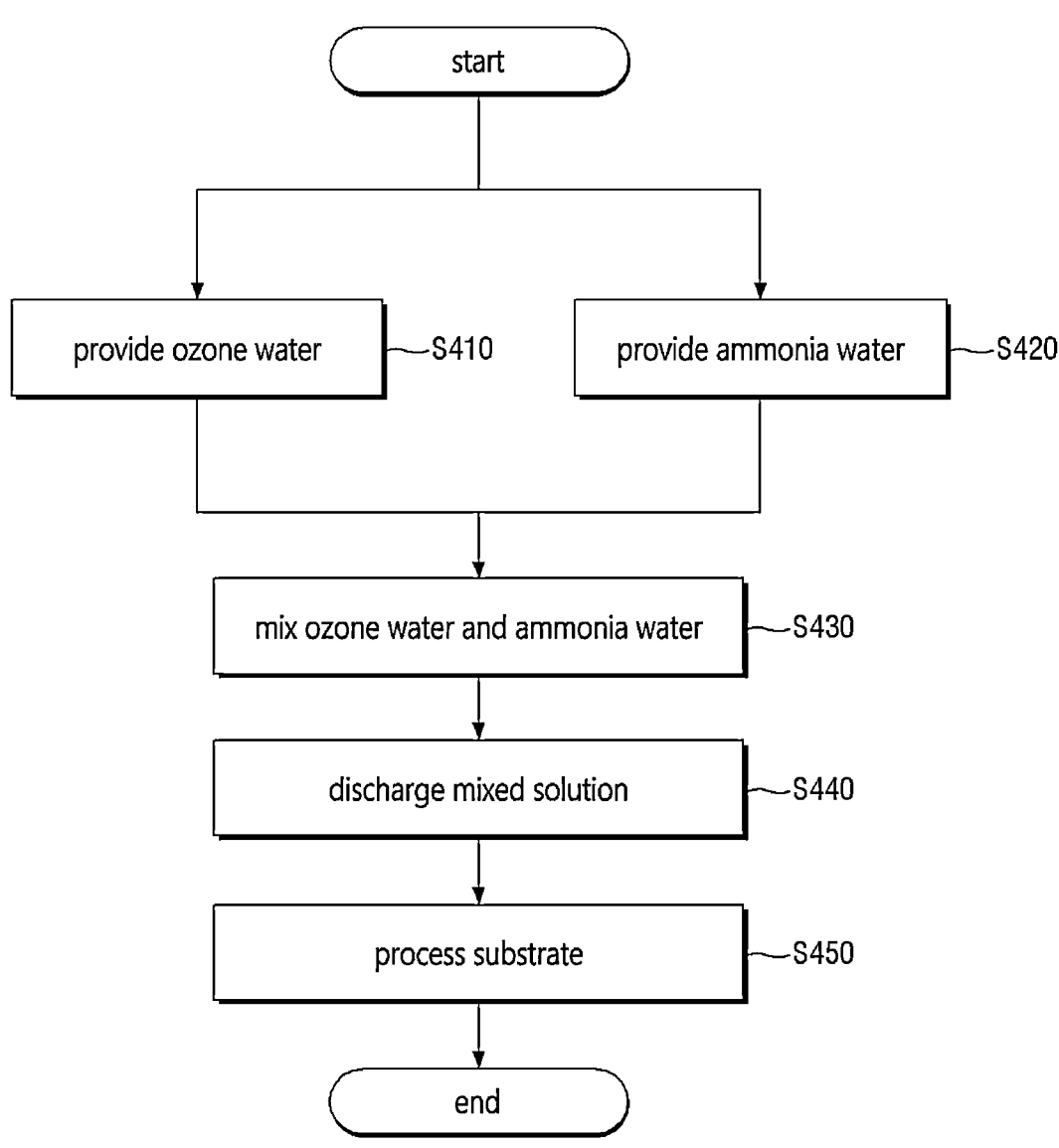
FIG. 14 is a flowchart sequentially showing a substrate processing method using a substrate processing apparatus.

FIG. 14 is a flowchart sequentially showing a substrate processing method using a substrate processing apparatus. The following description refers to FIGS. 3 and 14.

The substrate processing method of FIG. 14 may utilize the nozzle structure 241 in the substrate processing apparatus 110, of which exemplary structure is shown in FIG. 3. However, it is not limited to this, but other structures of the nozzle structure 241 shown in the examples of FIGS. 4 to 13 can be applied to the substrate processing method of FIG. 14.

First, ozone water (O3DIW) is provided to the reaction space module 330 through the first inlet pipe 310 (S410). In addition, ammonia water (NH4OH) is also provided to the reaction space module 330 through the second inlet pipe 320 (S420).

Ammonia water may be provided to the reaction space module 330 at the same time as ozone water. However, it is not limited to this, and it is possible for the ammonia water to be provided to the reaction space module 330 with a time difference from the ozone water. When ozone water and ammonia water are mixed to produce a mixed solution to peel off photoresist, the amount of ammonia water may be small compared to the ozone water. Taking this into account, the ammonia water may be provided to the reaction space module 330 later than the ozone water.

When ozone water and ammonia water are provided to the reaction space module 330, ozone water and ammonia water are mixed in the reaction space module 330 (S430). When ozone water and ammonia water are mixed, a reaction may occur between the ozone water and ammonia water, and a reactive gas may be generated due to the reaction.

Afterwards, the mixed solution of ozone water and ammonia water is discharged onto the substrate W through the discharge pipe 340 and the discharge port (S440), and the mixed solution removes the photoresist from the substrate W so that the substrate W is processed (S450).

The present invention includes process conditions for adding ammonia water to ozone water for effective peeling of photoresist. However, the structure, in which ammonia water is added, is mixed inside the nozzle structure 241 that discharges the chemical solution to the substrate W, and ammonia water of a certain concentration is mixed.

In the photoresist removal process using high-concentration ozone water, relatively high-concentrated ozone water is used, and it can be confirmed that the strip effect is high only when ammonia water of a certain concentration is diluted. According to the experimental results, based on the use of ozone water of 80 ppm to 120 ppm, it can be confirmed that the effect of removing photoresist is most excellent when using ammonia water concentration of 800 ppm to 1000 ppm. OH radicals can be activated through the decomposition reaction of ozone water by ammonia water, and in the present invention, a nozzle mixing method can be applied to the process for this purpose.

Photoresist removal using ozone water has a problem in that the time cannot be shortened enough to replace SPM in terms of process efficiency. In order to check whether diluting ammonia in ozone water is effective, KrF PR was applied to Bare Si to check the removal effect. As of 120 seconds, the PR removal power was at the level of 2000 Å~4000 Å at O3 120 ppm only, but when the process performance is checked by diluting NH4OH 900 ppm 120 ml/min at O3 120 ppm in nozzle mixing method, it can be confirmed that 13000 Å of photoresist is removed.

In addition, the amount of NH4OH added is effective from 50 ml or more, so it should be diluted to 50 ml/min~200 ml/min. The reason for not adding more than 200 ml is that PR removal performance may decrease due to acceleration of ozone water decomposition reaction, so a small amount of NH4OH is added when using ozone water.

Although embodiments of the present invention have been described above with reference to the attached drawings, the present invention is not limited to the above embodiments and can be manufactured in various different forms, and those skilled in the art can understand that the present invention can be implemented in other specific forms without changing its technical spirit or essential features. Therefore, the embodiments described above should be understood in all respects as illustrative and not restrictive.

What is claimed is:

1. An apparatus for processing a substrate, the apparatus comprising:
   a substrate support unit configured to support and rotate the substrate; and
   a spray unit including a nozzle structure, the spray unit being configured to discharge a substrate processing liquid onto the substrate using the nozzle structure,
   wherein the nozzle structure comprises,
      a first inlet pipe configured to provide a first chemical liquid;
      a second inlet pipe configured to provide a second chemical liquid;
      a plurality of reaction space modules configured to mix the first chemical liquid and the second chemical liquid, wherein the plurality of reaction space modules includes a first reaction space module and a second reaction space module fluidly connected to the first reaction space module in series, the first inlet pipe and the second inlet pipe are fluidly connected to the first reaction space module, the first inlet pipe is configured to discharge the first chemical liquid into the first reaction space module, the second inlet pipe is configured to discharge the second chemical liquid into the second reaction space module, the first reaction space module is configured to mix the first chemical liquid and the second chemical liquid, and the first reaction space module is configured to guide a mixture solution of the first chemical liquid and the second chemical liquid to the second reaction space module; and
      a discharge pipe fluidly connected to the second reaction space module and configured to discharge the mixture solution from the second reaction space module into the substrate processing liquid,
         wherein the first chemical liquid includes ozone gas, and the second chemical liquid includes an OH component.

2. The apparatus of claim 1, wherein the first chemical liquid is ozone water, in which the ozone gas is mixed with pure water, and the second chemical liquid is an aqueous liquid containing an ammonia component.

3. The apparatus of claim 1, wherein the first inlet pipe and the second inlet pipe are configured to provide the first chemical liquid and the second chemical liquid simultaneously.

4. The apparatus of claim 1, wherein a flow rate of the first chemical liquid and a flow rate of the second chemical liquid are different from each other.

5. The apparatus of claim 4, wherein the flow rate of the first chemical liquid is greater than the flow rate of the second chemical liquid.

6. The apparatus of claim 1, wherein the second chemical liquid has a smaller flow rate and higher concentration than the first chemical liquid.

7. The apparatus of claim 6, wherein a flow rate of the first chemical liquid is 1500 to 2000 ml/min, and a flow rate of the second chemical liquid is 50 to 200 ml/min.

8. The apparatus of claim 6, wherein a concentration of the first chemical liquid is 80 to 120 ppm and a concentration of the second chemical liquid is 800 to 1000 ppm.

9. The apparatus of claim 1, wherein a width of the first inlet pipe is different from a width of the second inlet pipe.

10. The apparatus of claim 9, wherein the width of the first inlet pipe is wider than the width of the second inlet pipe.

11. The apparatus of claim 1, wherein the nozzle structure further comprises,
   an open/close valve configured to control a flow of the mixture solution,
   wherein the open/close valve is in the discharge pipe.

12. The apparatus of claim 1, wherein the first reaction space module is configured to rotate in response to the first chemical liquid and the second chemical liquid being introduced in the first reaction space module.

13. The apparatus of claim 1, wherein the first chemical liquid and the second chemical liquid have different discharge start times or different total discharge times.

14. The apparatus of claim 1, wherein the apparatus is configured to remove photoresist from the substrate.

15. A method for processing a substrate comprising:
   providing a first chemical liquid containing ozone gas;
   providing a second chemical liquid containing an OH component
   wherein the first chemical liquid and the second chemical liquid are provided to an apparatus for processing the substrate, the apparatus including,
   a substrate support unit configured to support and rotate the substrate; and
   a spray unit including a nozzle structure, the spray unit being configured to discharge a substrate processing liquid onto the substrate using the nozzle structure,
   wherein the nozzle structure comprises,
   a first inlet pipe configured to provide the first chemical liquid,
   a second inlet pipe configured to provide the second chemical liquid, and
   a plurality of reaction space modules configured to mix the first chemical liquid and the second chemical liquid;
   mixing, using the plurality of reaction space modules, the first chemical liquid and the second chemical liquid to obtain the substrate processing liquid,
   wherein the plurality of reaction space modules includes a first reaction space module and a second reaction space module fluidly connected to the first reaction space module in series, the first inlet pipe and the second inlet pipe are fluidly connected to the first reaction space module, the first inlet pipe is configured to discharge the first chemical liquid into the first reaction space module, the second inlet pipe is configured to discharge the second chemical liquid into the second reaction space module, the first reaction space module is configured to mix the first chemical liquid and the second chemical liquid, and the first reaction space module is configured to guide a mixture solution of the first chemical liquid and the second chemical liquid to the second reaction space module, and wherein the nozzle structure further comprises a discharge pipe fluidly connected to the second reaction space module and configured to discharge the mixture solution from the second reaction space module into the substrate processing liquid; and processing the substrate by providing the substrate processing liquid to the substrate.

16. The method of claim 15, wherein providing the first chemical liquid and providing the second chemical liquid are performed simultaneously.

17. The method of claim 15, wherein the processing the substrate includes processing the substrate to remove photoresist from the substrate.

18. An apparatus for processing a substrate, the apparatus comprising:

a substrate support unit configured to support and rotate the substrate; and a spray unit including a nozzle structure, the spray unit being configured to discharge a substrate processing liquid onto the substrate using the nozzle structure, wherein the nozzle structure comprises, a first inlet pipe configured to provide a first chemical liquid;

a second inlet pipe configured to provide a second chemical liquid;

a plurality of reaction space modules configured to mix the first chemical liquid and the second chemical liquid, wherein the plurality of reaction space modules includes a first reaction space module and a second reaction space module fluidly connected to the first reaction space module in series, the first inlet pipe and the second inlet pipe are fluidly connected to the first reaction space module, the first inlet pipe is configured to discharge the first chemical liquid into the first reaction space module, the second inlet pipe is configured to discharge the second chemical liquid into the second reaction space module, the first reaction space module is configured to mix the first chemical liquid and the second chemical liquid, and the first reaction space module is configured to guide a mixture solution of the first chemical liquid and the second chemical liquid to the second reaction space module; and a discharge pipe fluidly connected to the second reaction space module and configured to discharge the mixture solution from the second reaction space module into the substrate processing liquid, wherein the first chemical liquid is ozone water, the ozone water including ozone gas mixed with pure water, and the second chemical liquid is an aqueous liquid including an ammonia component, wherein the first inlet pipe and the second inlet pipe are configured to provide the first chemical liquid and the second chemical liquid simultaneously, and a flow rate of the first chemical liquid is greater than a flow rate of the second chemical liquid, and wherein the second chemical liquid has a higher concentration than the first chemical liquid.

* * * * *